US007522084B2

(12) United States Patent
Huang et al.

(10) Patent No.: US 7,522,084 B2
(45) Date of Patent: Apr. 21, 2009

(54) CYCLE TIME TO DIGITAL CONVERTER

(75) Inventors: Hong-Yi Huang, Taipei (TW); Sheng-Dar Wu, Taipei (TW); Yuan-Hua Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/826,339

(22) Filed: Jul. 13, 2007

(65) Prior Publication Data

US 2008/0111720 A1 May 15, 2008

(30) Foreign Application Priority Data

Nov. 10, 2006 (TW) .............................. 95141655 A

(51) Int. Cl.
*H03M 1/60* (2006.01)

(52) U.S. Cl. ....................... 341/157; 341/155; 341/156; 341/182

(58) Field of Classification Search ................. 341/155, 341/156, 157, 182
See application file for complete search history.

(56) References Cited

U.S. PATENT DOCUMENTS 4,053,926 A * 10/1977 Lemoine et al. ............... 386/14
4,118,738 A * 10/1978 Arnstein ...................... 348/497
5,252,977 A * 10/1993 Lueker et al. ............... 341/182

OTHER PUBLICATIONS

Dudek et al., IEEE Transactions on Solid-State Circuits, vol. 35, No. 2, Feb. 2000, pp. 240 to 247.

Chen et al., 1997 IEEE International Symposium on Circuits and Systems, Jun. 9-12, 1997, Hong Kong, pp. 281-284.

Bigongiari et al., IEEE Transactions on Nuclear Science, vol. 46, No. 2, Apr. 1999, pp. 73-77.

Gerds et al., IEEE Journal of Solid-State Circuits, vol. 29, No. 9, Sep. 1994, pp. 1068-1076.

Chen et al., IEE 1999 Custom Integrated Circuits Conference, pp. 605-608.

Gorbics et al., IEEE Transactions on Nuclear Science, vol. 44, No. 3, Jun. 1997, pp. 379-384.

Maatta et al., IEEE Transactions on Instrumentation and Measurement, vol. 47, No. 2, Apr. 1998, pp. 521-536.

Hwang et al., IEEE Transactions on Nuclear Science, vol. 51, No. 4, Aug. 2004, pp. 1349-1352.

(Continued)

*Primary Examiner*—Jean B Jeanglaude
(74) *Attorney, Agent, or Firm*—Birch, Stewart, Kolasch & Birch, LLP

(57) ABSTRACT

A cycle time to digital converter includes a dual delay lock loop, multi phase sampling detector and VDL sampling detector. The dual delay lock loop generates the first voltage corresponding to the first delay time and the second voltage corresponding to the second delay time. The multi phase sampling detector receives first start signal, first stop signal and first voltage to detect a coarse delay time, generates the first group signals according to the coarse delay time, delays the first stop signal by a common delay time to generate the second stop signal, and delays the first start signal by the coarse delay time and the common delay time to generate the second start signal. The VDL sampling detector receives first voltage, second voltage, second start signal and second stop signal for detecting a fine delay time and generates the second group signals according to the fine delay time.

22 Claims, 11 Drawing Sheets

100

OTHER PUBLICATIONS

Hwang et al., "A High-Resolution and Fast-Conversion Time-To-Digital Converter," pp. 37-40.

Gray et al., IEEE Journal of Solid-State Circuits, vol. 29, No. 3, Mar. 1994, pp. 340-349.

Arai et al., IEEE Journal of Solid-State Circuits, vol. 31, No. 2, Feb. 1996, pp. 212-220.

Raisanen-Ruotsalainen et al., "A Time Digitizer with Interpolation Based on Time-to-Voltage Conversion," pp. 197-200.

Karadamoglou et al., IEEE Journal of Solid-State Circuits, vol. 39, No. 1, Jan. 2004, pp. 214-222.

Christiansen, IEEE Transactions on Nuclear Science, vol. 42, No. 4, Aug. 1995, pp. 753-757.

Ruotsalainen et al., IEEE Journal of Solid-State Circuits, vol. 35, No. 10, Oct. 2000, pp. 1507-1510.

Ko et al., "High Performance, Energy Efficient Master-Slave Flip-Flop Circuits," pp. 16-17.

Arai et al., IEEE Transactions on Nuclear Science, vol. 36, No. 1, Feb. 1989, pp. 528-531.

* cited by examiner

200

210

CLOCK

220

600

CYCLE TIME TO DIGITAL CONVERTER

BACKGROUND OF THE INVENTION

1. Field of the Invention

The invention relates to a cycle time to digital converter, and in particular relates to a cycle time to digital converter with a pulse divider, a decoding circuit and an interface circuit.

2. Description of the Related Art

FIG. 1 is a schematic diagram of a conventional time to digital converter (TDC) 10. Time to digital converter 10 comprises dual delay lock loop (dual DLL) 12, multi phase sampling detector 14 and vernier delay line sampling detector (VDL sampling detector) 15. Dual DLL 12 generates first voltage $V_{BNF}$ and second voltage $V_{BNS}$ according to reference clock signal CLOCK, transmits first voltage $V_{BNF}$ to multi phase sampling detector 14 and VDL sampling detector 15 and transmits second voltage $V_{BNS}$ to VDL sampling detector 15. Multi phase sampling detector 14 receives input signal INPUT, reference clock signal CLOCK and first voltage $V_{BNF}$ to generate digital codes ($P_0$~$P_{n-}$). VDL sampling detector 15 receives input signal INPUT', first voltage $V_{BNF}$ and second voltage $V_{BNS}$ to generate digital codes ($V_0$~$V_{m-}$).

However, conventional TDC 10 can only detect the time difference between input signal INPUT and reference clock signal CLOCK, but it can't detect high frequency input signal INPUT.

BRIEF SUMMARY OF THE INVENTION

A detailed description is given in the following embodiments with reference to the accompanying drawings.

A cycle time to digital converter is provided. The cycle time to digital converter comprises a dual delay lock loop, a multi phase sampling detector, a VDL sampling detector, an edge detector, a first readout circuit and a second readout circuit. The dual delay lock loop generates a first voltage and a second voltage according to a clock signal. The multi phase sampling detector receives a first start signal, a first stop signal and the first voltage, detects a coarse delay time according to the first start signal and the first stop signal, generates first group signals according to the coarse delay time, delays the first stop signal by a common delay time to generate a second stop signal, and delays the first start signal by the coarse delay time and the common delay time to generate a second start signal. The VDL sampling detector receives the first voltage, the second voltage, the second start signal and the second stop signal, detects a fine delay time according to the second start signal and the second stop signal, and generates second group signals according to the fine delay time. The edge detector receives an input signal and generates the first start signal and the first stop signal according to a rising edge and a falling edge of the input signal. The first readout circuit receives the first group signals to output first group coding signals. The second readout circuit receives the second group signals to output second group coding signals.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
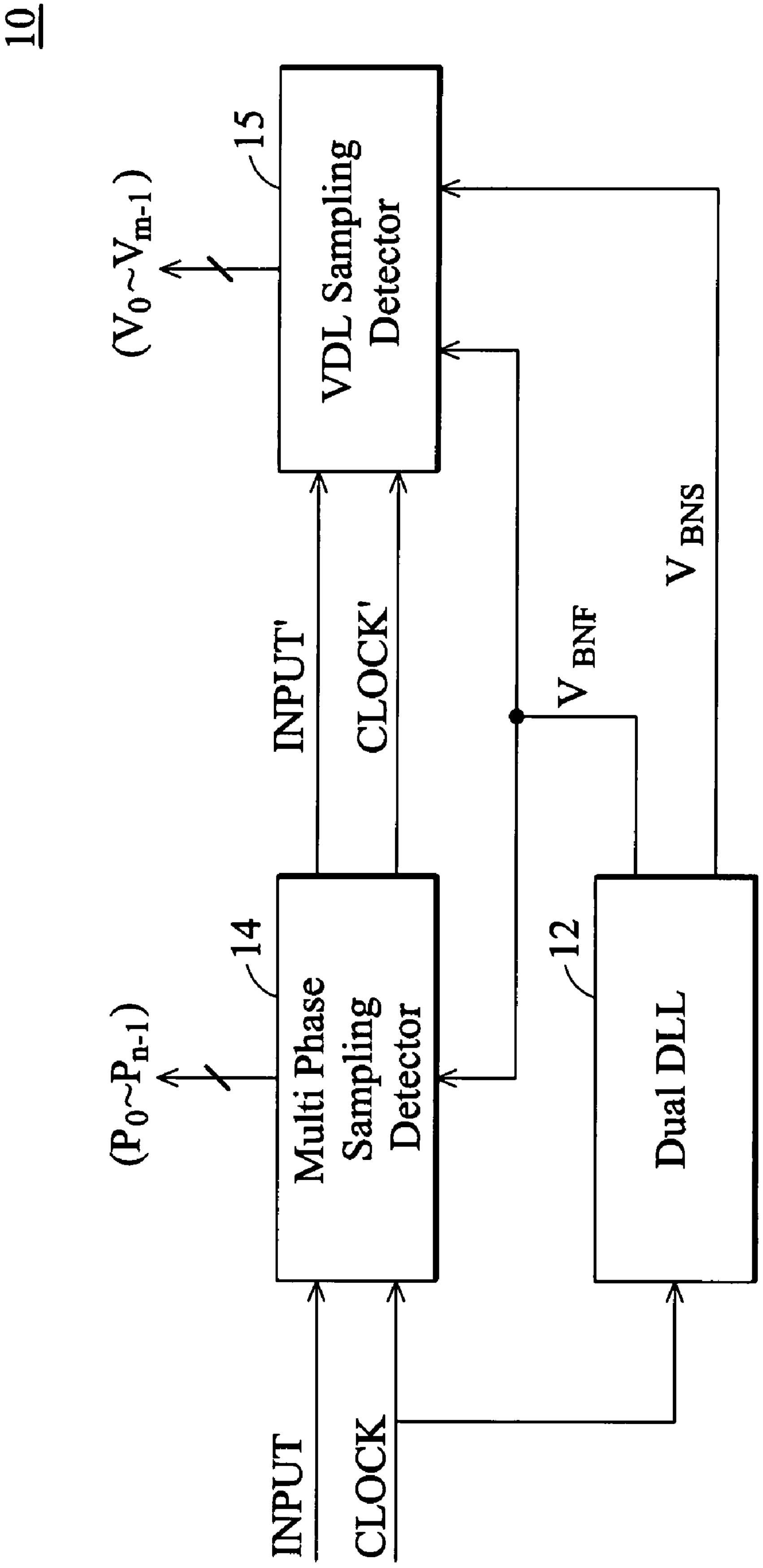
FIG. 1 (PRIOR ART)
FIG. 1 is a schematic diagram of a conventional time to digital converter.
Figure 2:
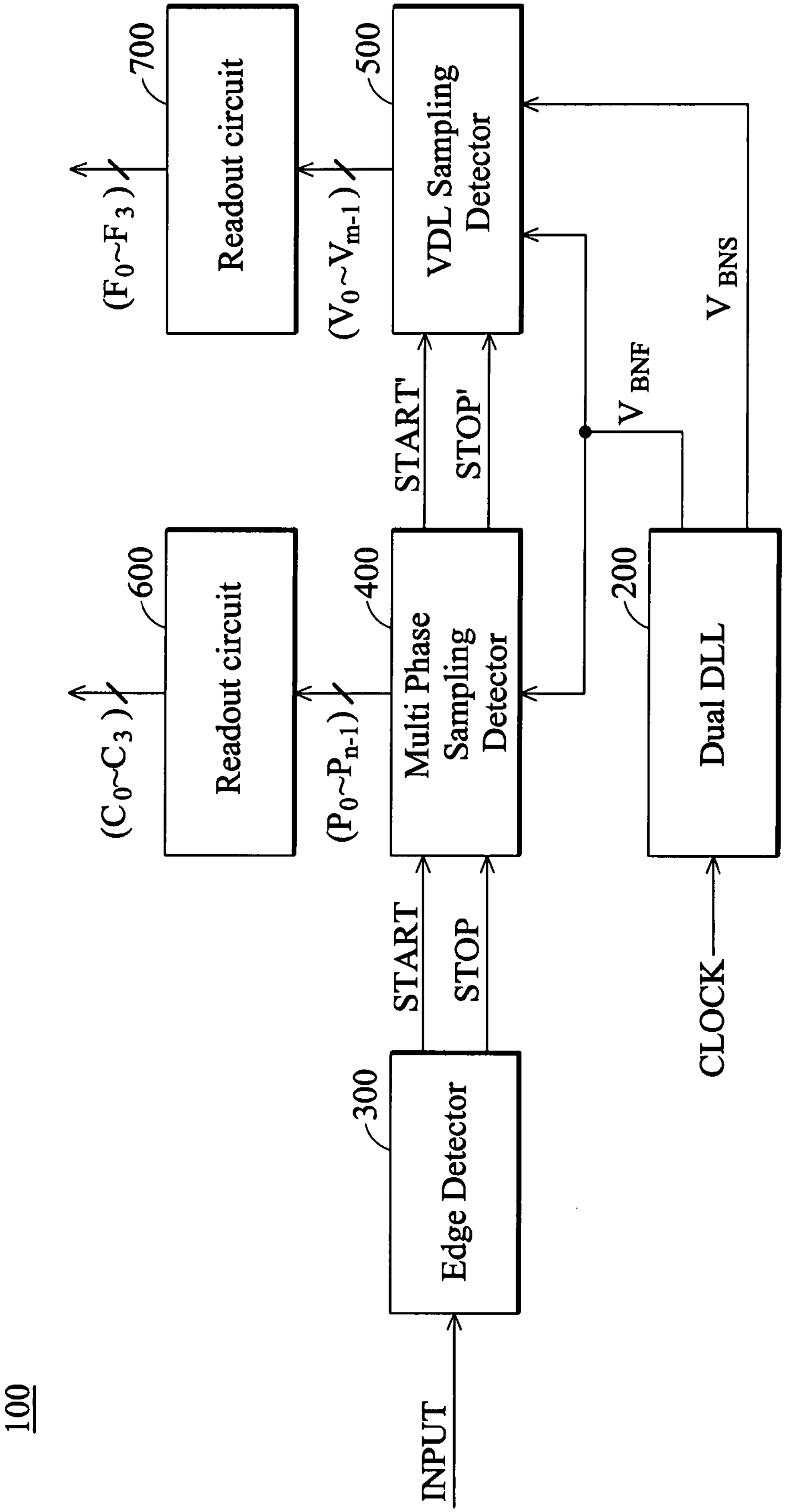
FIG. 2 is a block diagram of a cycle time to digital converter according to an embodiment of the invention.

FIG. 2 is a block diagram of a cycle time to digital converter (CDC) 100 according to an embodiment of the invention. The main function of CDC 100 is to convert the width of input pulse signal INPUT to digital codes ($C_0$~$C_3$, $F_0$~$F_3$). CDC 100 comprises dual DLL 200, edge detector 300, multi phase sampling detector (first-stage time to digital converting circuit) 400, VDL sampling detector (second-stage time to digital converting circuit) 500, first readout circuit 600 and second readout circuit 700. Edge detector 300 respectively generates start signal START and stop signal STOP according to the rising edge and the falling edge of input pulse signal INPUT. For example, when the rising edge of the input pulse signal occurs, edge detector 300 generates start signal START, and when the falling edge of the input pulse signal occurs, edge detector 300 generates stop signal STOP. According to an embodiment of the invention, edge detector 300 has the dividing frequency function for input pulse signal INPUT. Dual DLL 200 generates the first voltage $V_{BNF}$ and second voltage $V_{BNS}$ according to reference clock signal CLOCK, transmits the first voltage $V_{BNF}$ to multi phase sampling detector 400 and VDL sampling detector 500 and transmits the second voltage $V_{BNS}$ to VDL sampling detector 500. Multi phase sampling detector 400 receives start signal START, stop signal STOP and the first voltage $V_{BNF}$ to generate digital codes ($P_0$~$P_{n-}$). VDL sampling detector 500 receives second start signal START', second stop signal STOP', the first voltage $V_{BNF}$ and the second voltage $V_{BNS}$ to generate digital codes ($V_0$~$V_{m-}$). First readout circuit 600 generates digital codes ($C_0$~$C_3$) according to digital codes ($P_0$~$P_{n-}$). Second readout circuit 700 generates digital codes ($F_0$~$F_3$) according to digital codes ($V_0$~$V_{m-}$).

Figure 3:
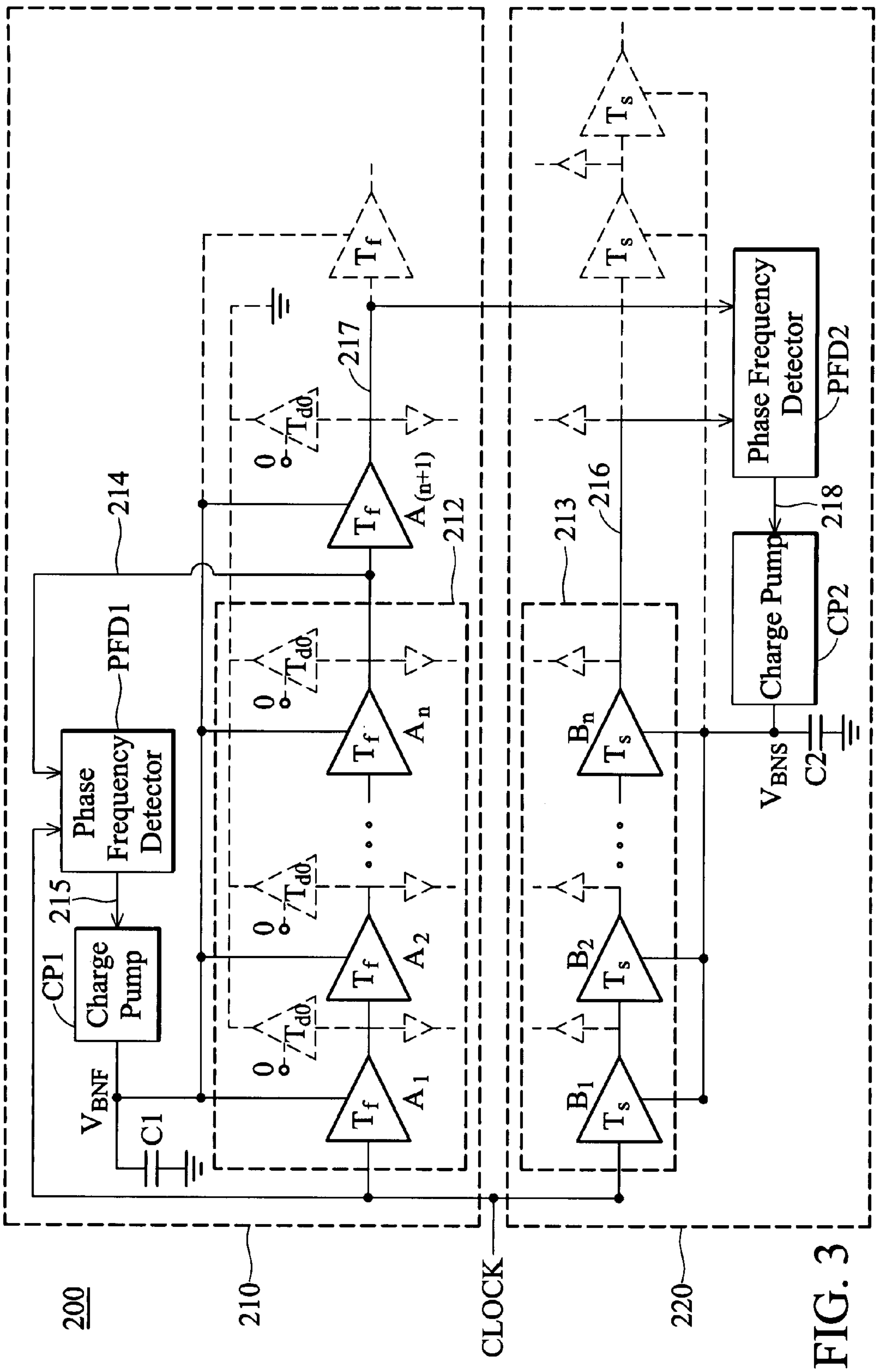
FIG. 3 shows a dual DLL according to another embodiment of the invention.

FIG. 3 shows dual DLL 200 according to another embodiment of the invention. Dual DLL 200 comprises fast DLL 210 and slow DLL 220. Fast DLL 210 comprises N+1 delay circuits ($A_1$, $A_2$ . . . $A_{n+1}$), phase frequency detector PFD1, charge pump CP1, capacitor C1 (low pass filter). Dual DLL 200 further comprises a plurality of dummy devices, as shown by the dotted lines, for matching with the output loading of the multi phase sampling detector and vernier delay line sampling detector.

N stage delay circuit (voltage-controlled delay line) 212 comprises N delay circuits ($A_1$, $A_2$ . . . $A_n$) to be coupled in serial. Each delay circuit ($A_1$, $A_2$ . . . $A_n$) delays clock signal CLOCK by first delay time $T_f$ according to first voltage $V_{BNF}$. N stage delay circuit 212 delays clock signal CLOCK by N times of first delay time ($N*T_f$) to generate first delay clock signal 214 (N is an integer). Phase frequency detector PFD1 generates and transmits first control signal 215 to first charge pump CP1 by detecting first delay clock signal 214 and reference clock signal CLOCK. First charge pump CP1 outputs first voltage $V_{BNF}$ according to first control signal 215. In addition, capacitor C1 can filter the high frequency noise of the first voltage $V_{BNF}$.

Third delay circuit $A_{n+1}$ receives first delay clock signal 214, and delays first delay clock signal 214 by first delay time $T_f$ according to first voltage $V_{BNF}$ to generate third delay clock signal 217.

N stage delay circuit (voltage-controlled delay line) 213 comprises N delay circuits ($B_1$, $B_2$ . . . $B_n$) to be coupled in serial. Each delay circuit ($B_1$, $B_2$ . . . $B_n$) delays clock signal CLOCK by second delay time $T_s$ according to second voltage $V_{BNS}$. N stage delay circuit 213 delays clock signal CLOCK by N times of second delay time ($N*T_s$) to generate second delay clock signal 216. Phase frequency detector PFD2 generates and transmits second control signal 218 to second charge pump CP2 by detecting the second delay clock signal 216 and the third delay clock signal 217. Second charge pump CP2 outputs second voltage $V_{BNS}$ according to second control signal 218. In addition, capacitor C2 can filter the high frequency noise of the second voltage $V_{BNS}$. Since the period of the clock signal CLOCK is $T_{CLK}$, first delay time $T_f$ is $T_{CLK}/n$ and second delay time $T_s$ is $T_{CLK}*(n+1)/n^2$.

Figure 4:
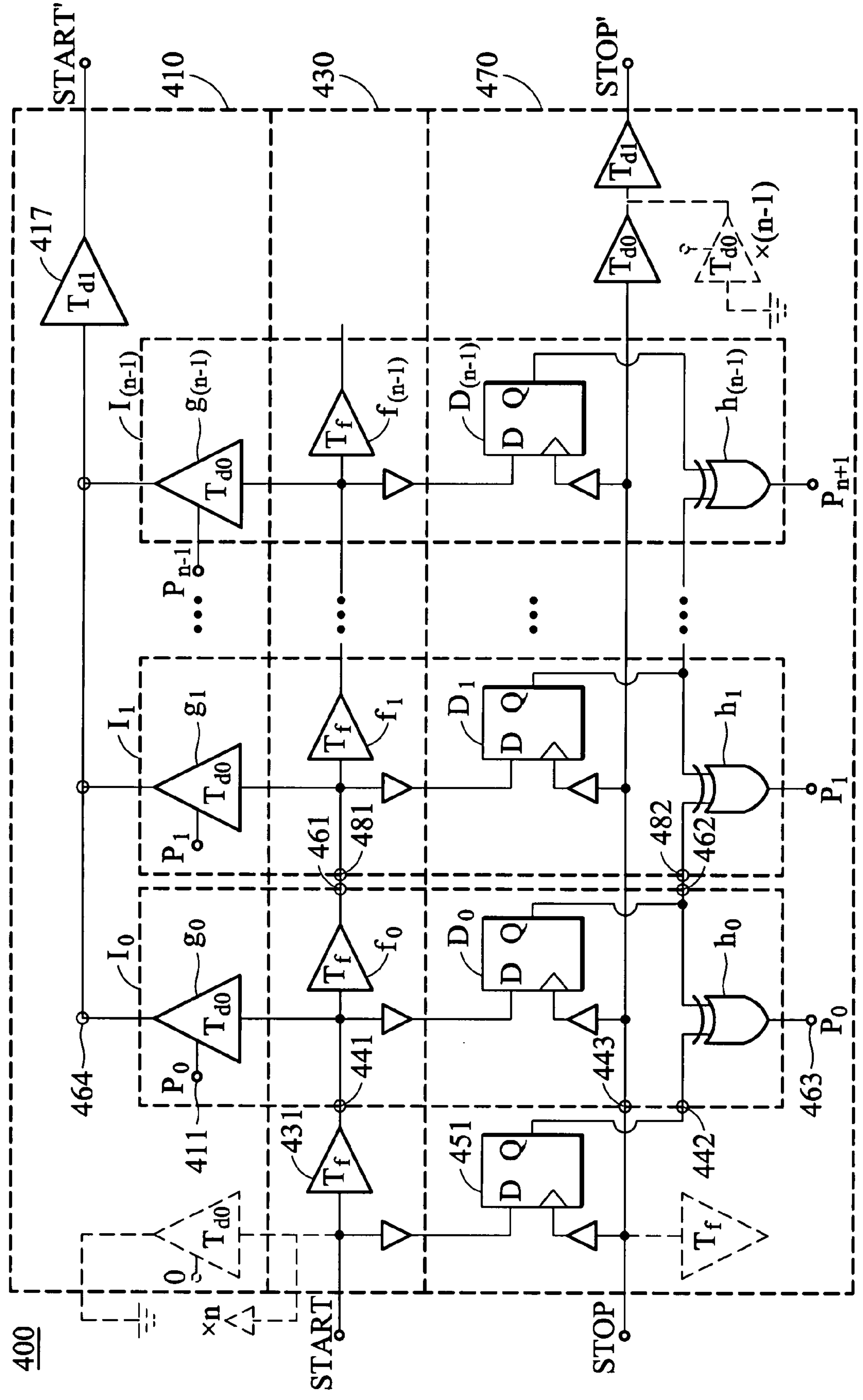
FIG. 4 shows a multi phase sampling detector according to another embodiment of the invention.

FIG. 4 shows multi phase sampling detector 400 according to another embodiment of the invention. Multi phase sampling detector 400 detects the coarse delay time according to the time difference between start signal START and stop signal STOP. It is noted that the coarse delay time is an integral time of the first delay time $T_f$. Multi phase sampling detector 400 further comprises a plurality of dummy devices Du, as shown by the dotted lines, for start signal START and stop signal STOP having the same loading. Multi phase sampling detector 400 comprises flip flop 451, delay device 431, N stage delay modules ($I_0$, $I_1$ . . . $I_{(n-1)}$), delay device 417 (output buffer circuit) (delay time $T_{d1}$) and matching delay unit 470 (delay time $T_{d1}+T_{d0}$). Each N stage delay module ($I_0$, $I_1$ . . . $I_{(n-1)}$) respectively comprises flip flops ($D_0$, $D_1$ . . . $D_{(n-1)}$), delay devices ($f_0$, $f_1$ . . . $f_{(n-1)}$) (delay time $T_f$), delay circuits ($g_0$, $g_1$ . . . $g_{(n-1)}$) (delay time $T_{d0}$, tri state buffer) and XOR gates ($h_0$, $h_1$ . . . $h_{(n-1)}$).

As shown in FIG. 4, interface circuit 410 comprises the delay device 417 and delay circuits ($g_0$, $g_1$ . . . $g_{(n-1)}$). Coarse code generator 450 comprises XOR gates ($h_0$, $h_1$ . . . $h_{(n-1)}$) and flip flops (451, $D_0$, $D_1$ . . . $D_{(n-1)}$). Delay line 430 comprises delay devices ($f_0$, $f_1$ . . . $f_{(n-1)}$).

Using delay module $I_0$ as an example, delay module $I_0$ comprises flip flop $D_0$, delay device $f_0$, delay circuit $g_0$ and XOR gate $h_0$. Delay module $I_0$ further comprises first input terminal 441, second input terminal 442, third input terminal 443, control terminal 411, first output terminal 461, second output terminal 462, third output terminal 463 and fourth output terminal 464. The input terminals of flip flop $D_0$ are coupled to first input terminal 441 and third input terminal 443 of delay module $I_0$. The output terminal of flip flop $D_0$ is coupled to second output terminal 462 of delay module $I_0$. The input terminal and the output terminal of delay device $f_0$ are respectively coupled to first input terminal 441 and first output terminal 461 of delay module $I_0$. The input terminal, the control terminal and the output terminal of the delay circuit $g_0$ are respectively coupled to first input terminal 441, control terminal and fourth output terminal 464 of delay module $I_0$. The first input terminal, the second input terminal and the output terminal of XOR gate $h_0$ are respectively coupled to second input terminal 442, second output terminal 462 and third output terminal 463 of delay module $I_0$. Since connection between all N stage delay modules ($I_0$, $I_1$ . . . $I_{(n-1)}$) is the same, delay module 10 is illustrated as an example. First output terminal 461 and second output terminal 462 of delay module $I_0$ are respectively coupled to first input terminal 481 and second input terminal 482 of delay module $I_1$. Third input terminal 443 of delay module $I_0$ receives stop signal STOP. Third output terminal 463 of delay module $I_0$ is coupled to control terminal 411 of delay module $I_0$ to control the output of fourth output terminal 464. Flip flop 451 generates a signal to second input terminal 442 of delay module $I_0$ according to start signal START and stop signal STOP. Delay device 431 delays start signal START by delay time $T_f$ and outputs start signal START to first input terminal 441 of delay module $I_0$. Third output terminal 463 of delay module $I_0$ outputs signal $P_0$ corresponding to the coarse delay time to control terminal 441 of delay module $I_0$. Other delay modules ($I_1$ . . . $I_{(n-1)}$) are similar with delay module $I_0$.

Figure 5:
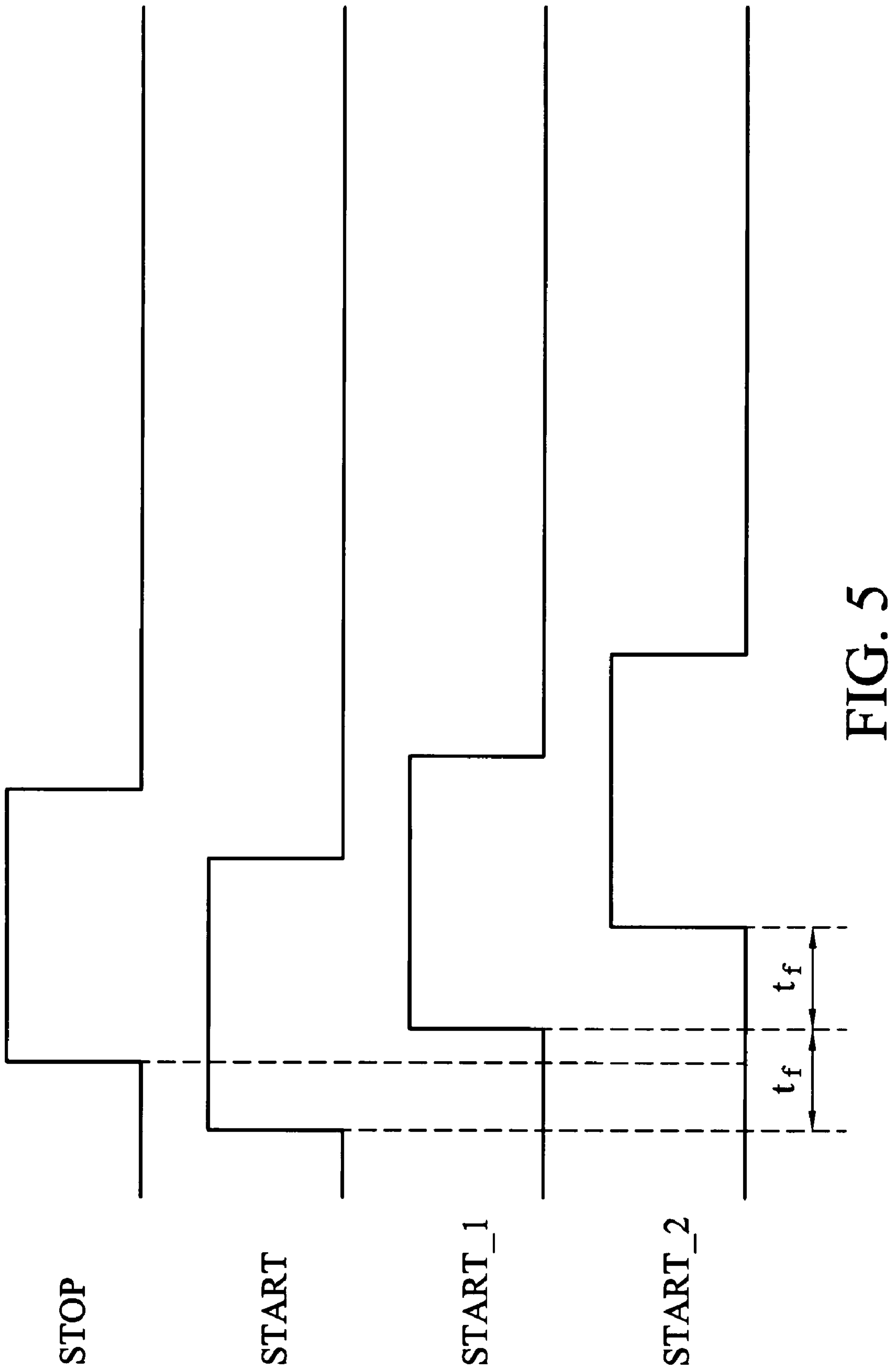
FIG. 5 is a timing diagram of the multi-phase detector according to an embodiment of the invention.

FIG. 5 is a timing diagram of multi phase sampling detector 400 according to an embodiment of the invention. When start signal START which is delayed by delay device ($f_0$, $f_1$ . . . $f_{(n-1)}$) the coarse delay time begins behind stop signal STOP, XOR gates ($h_0$, $h_1$ . . . $h_{(n-1)}$) output first group signal ($P_0$, $P_1$ . . . $P_{(n-1)}$) to turn on one of delay circuit ($g_0$, $g_1$ . . . $g_{(n-1)}$) for transmitting from one of the delay devices ($f_0$, $f_1$ . . . $f_{(n-1)}$) through corresponding delay circuit ($g_0$, $g_1$ . . . $g_{(n-1)}$) to delay device 417. Using FIG. 5 as an example, when start signal START_1 lags behind stop signal STOP, delay circuit $g_0$ is turned on. Delay circuit $g_0$ and delay device 417 delay start signal START_1 by delay time ($T_{d0}+T_{d1}$) to output signal START'. Matching delay unit 470 delays stop signal STOP by delay time ($T_{d0}+T_{d1}$) to output signal STOP'.

Figure 6:
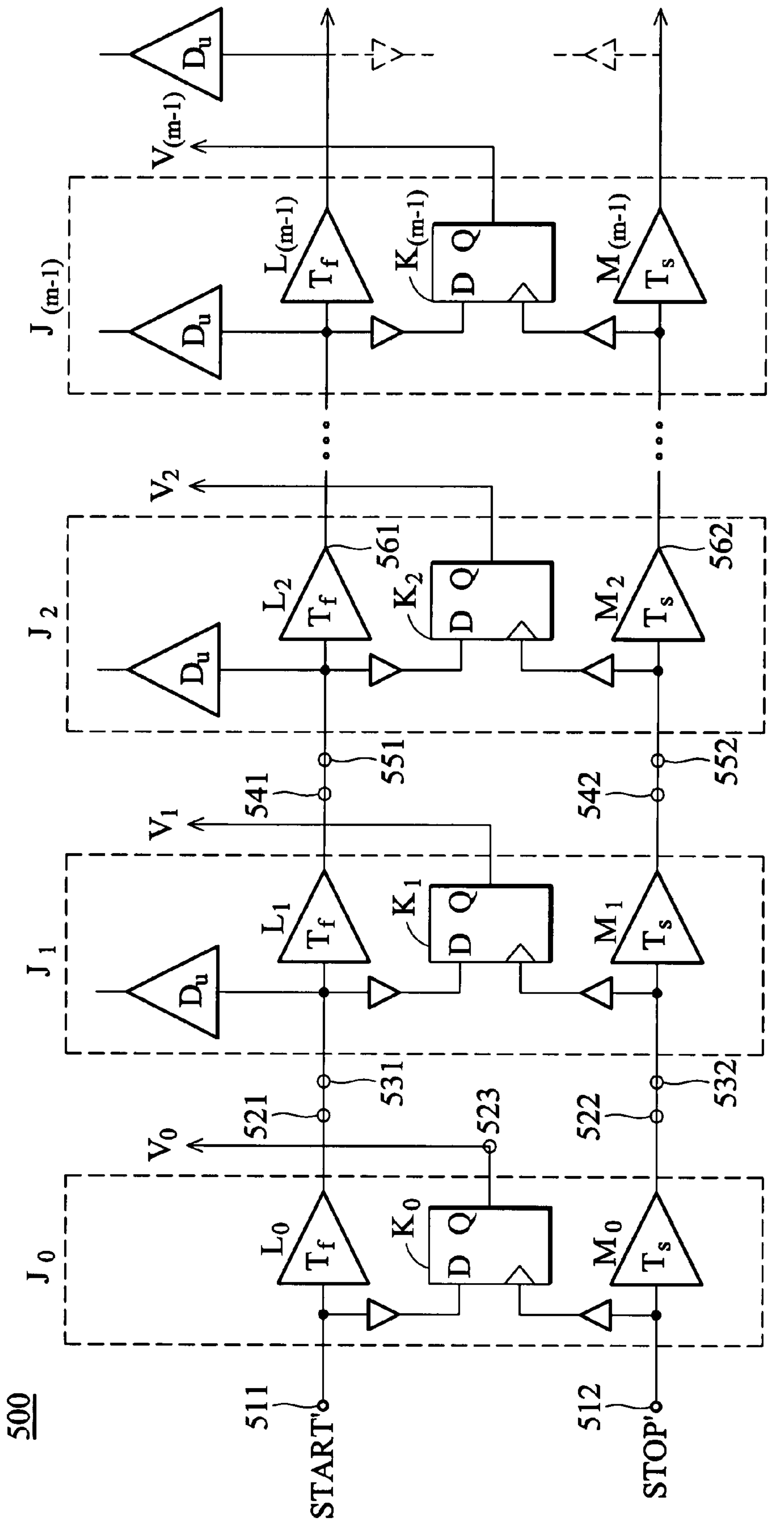
FIG. 6 shows a VDL sampling detector according to another embodiment of the invention.

FIG. 6 shows VDL sampling detector 500 according to another embodiment of the invention. VDL sampling detector 500 detects the fine delay time according to the time difference between start signal START' and stop signal STOP'. VDL sampling detector 500 comprises N stage delay modules ($J_0$, $J_1$ . . . $J_{(m-1)}$) coupled in serial. Each N stage delay module ($J_0$, $J_1$ . . . $J_{(m-1)}$) respectively comprises one of flip flops ($K_0$, $K_1$ . . . $K_{(m-1)}$), one of first delay units ($L_0$, $L_1$ . . . $L_{(m-1)}$) (delay time $T_f$) and one of second delay units ($M_0$, $M_1$ . . . $M_{(m-1)}$) (delay time $T_s$). VDL sampling detector 500 also equalizes loading at each point by adding dummy devices.

Since the connection relation between all N stage delay units ($J_0$, $J_1$ . . . $J_{(m-1)}$) is the same, only delay unit $J_0$ is illustrated as an example. Delay unit $J_0$ comprises first input terminal 511, second input terminal 512, first output terminal 521, second output terminal 522 and third output terminal 523. First output terminal 511 and second output terminal 522 of delay unit $J_0$ are respectively coupled to first output terminal 531 and second input terminal 532 of delay unit $J_1$. Third output terminal 523 of delay unit $J_0$ outputs digital code $V_0$ corresponding to the fine delay time. The input terminal, the control terminal and the output terminal of the flip flop $K_0$ are respectively coupled to first input terminal 511, second input terminal 512 and third output terminal 523. The input terminal and the output terminal of first delay unit $L_0$ are respectively coupled to first input terminal 511 and first output terminal 521. The input terminal and the output terminal of second delay unit $M_0$ are respectively coupled to second input terminal 512 and second output terminal 522. Other delay units ($J_1 \ldots J_{(m-1)}$) are similar to delay $J_0$.

Figure 7:
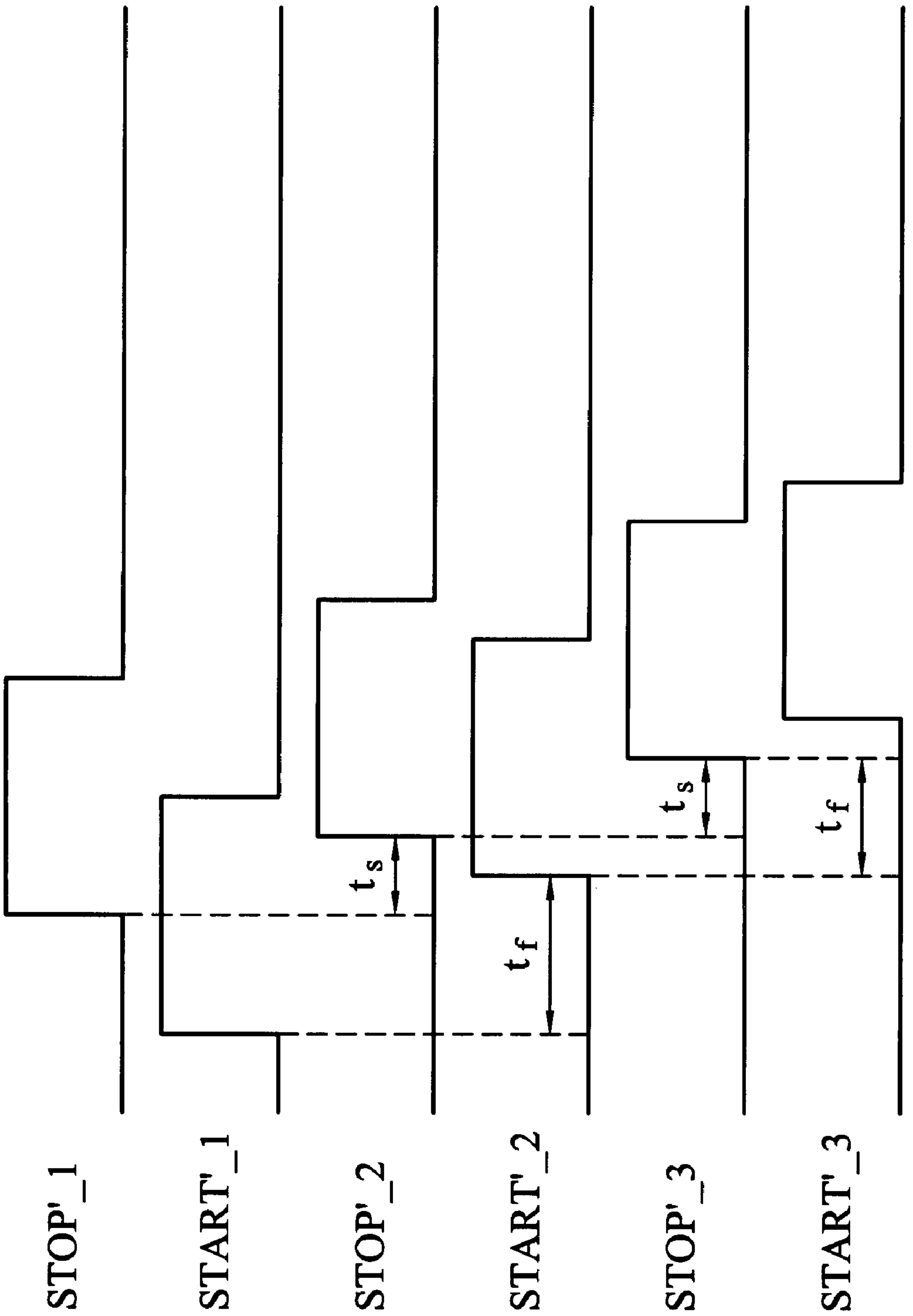
FIG. 7 is a timing diagram of start signals and stop signals according to an embodiment of the invention.

FIG. 7 is a timing diagram of start signals START'_1, START'_2 and START'_3 and stop signals STOP'_1, STOP'_2 and STOP'_3 according to an embodiment of the invention. Start signals START'_1, START'_2 and START'_3 are respectively output signals of first output terminals 521, 541 and 561. Stop signals STOP'_1, STOP'_2 and STOP'_3 are respectively output signals of second output terminals 522, 542 and 562. Using FIG. 7 as an example, since start signal START'_3 lags behind stop signal STOP'_3, digital code $V_0$ and $V_1$ are zero and digital code $V_2 \sim V_{(n-1)}$ are one.

Figure 8:
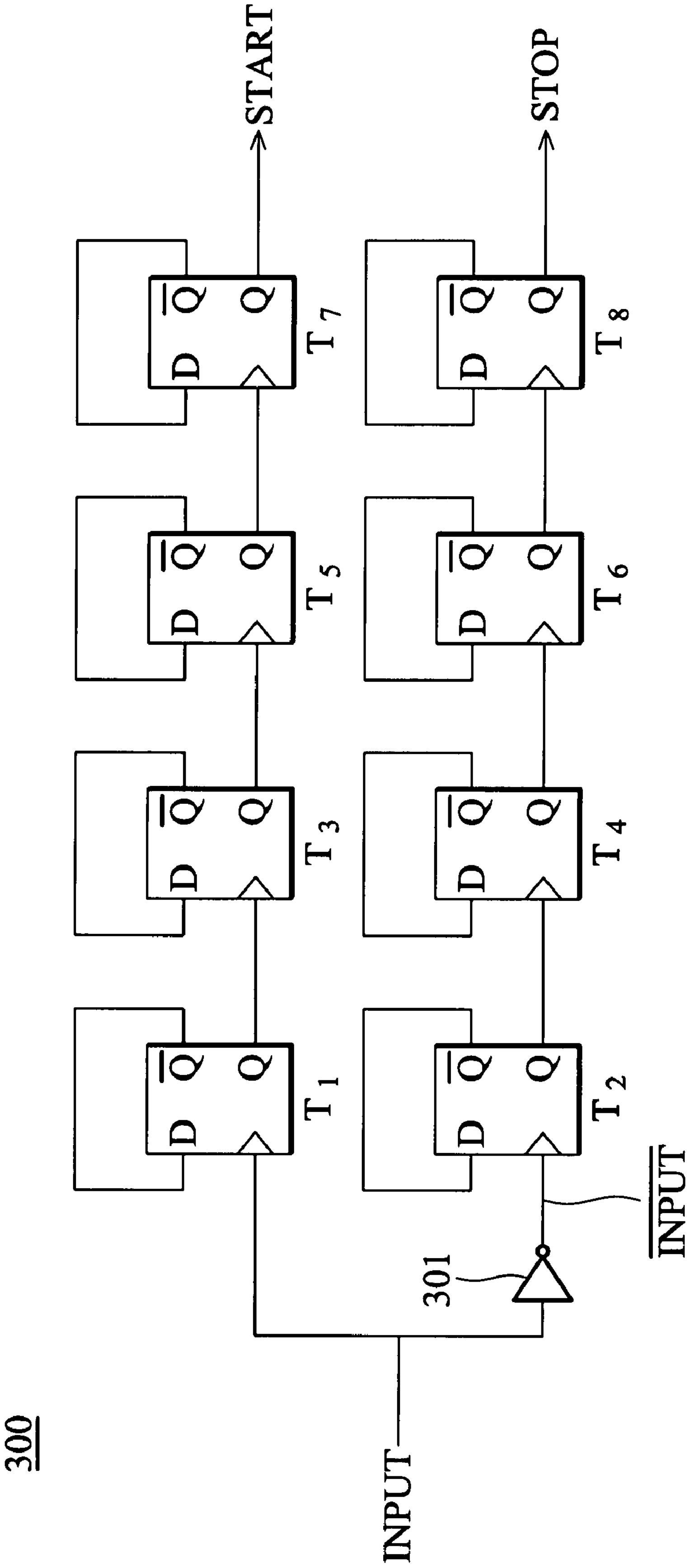
FIG. 8 shows an edge detector according to another embodiment of the invention.

FIG. 8 shows edge detector 300 according to another embodiment of the invention. Edge detector 300 comprises inverter 301 and flip flops T1, T2, T3, T4, T5, T6, T7 and T8. Each flip flop T1, T2, T3, T4, T5, T6, T7 and T8 has input terminal (>), output terminal (Q), first terminal (D) and second terminal ($\overline{Q}$). First terminals (D) of flip flops T1, T2, T3, T4, T5, T6, T7 and T8 are respectively connected back to second terminals ($\overline{Q}$) of flip flops T1, T2, T3, T4, T5, T6, T7 and T8 as shown in FIG. 8. Inverter 301 generates inverting input signal $\overline{\text{INPUT}}$ according to input signal INPUT. Flip flops T1, T3, T5 and T7 are connected in serial and flip flops T2, T4, T6 and T8 are also connected in serial as shown in FIG. 8. The input terminal of flip flop T1 receives input signal INPUT. The input terminal of flip flop T2 receives inverting input signal $\overline{\text{INPUT}}$. Each output terminal of the flip flops is coupled to each input terminal of the next stage flip flops. The output terminal of flip flop T7 outputs start signal START and the output terminal of flip flop T8 outputs stop signal STOP.

Figure 9:
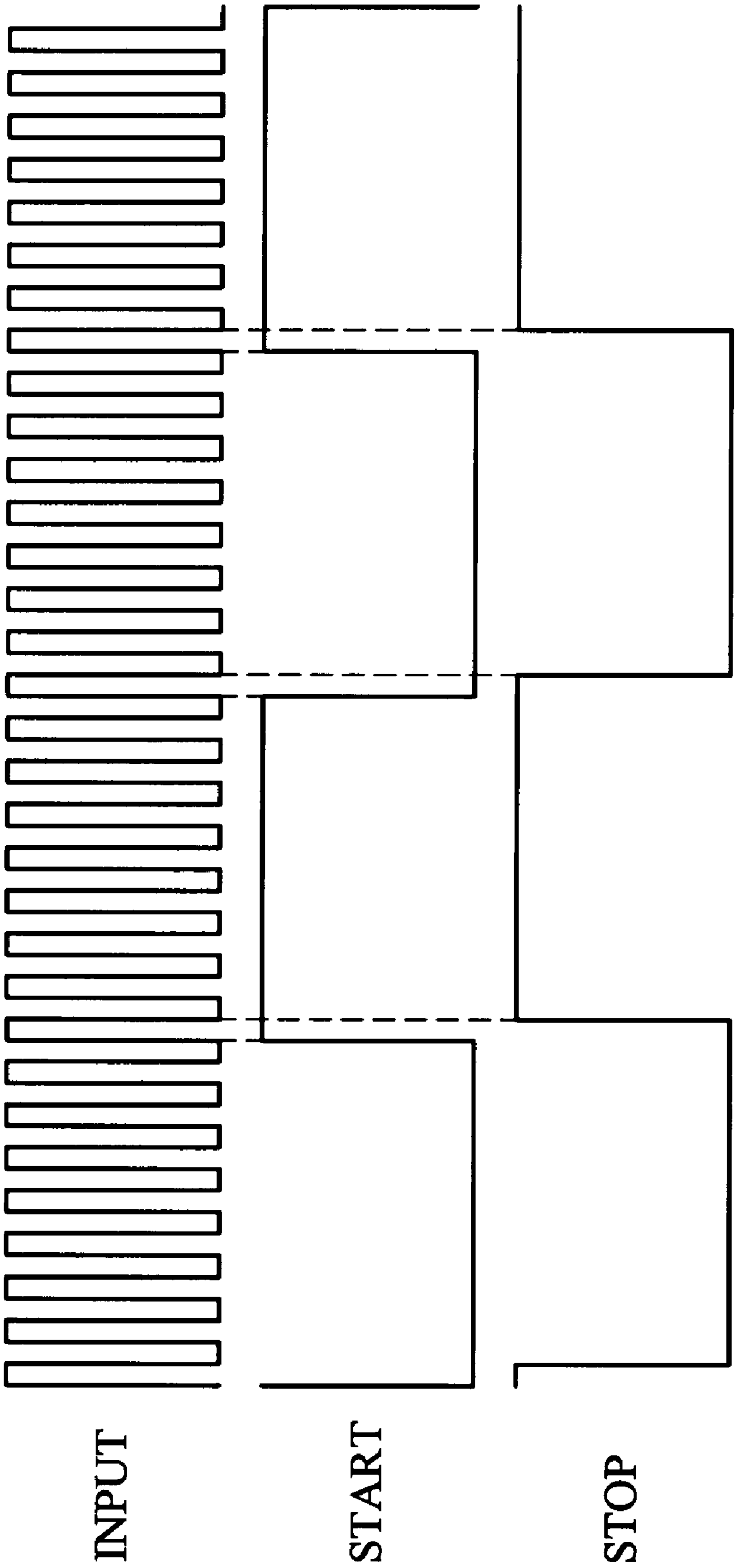
FIG. 9 is a timing diagram of an input signal, a start signal and a stop signal of the edge detector.

FIG. 9 is a timing diagram of input signal INPUT, start signal START and stop signal STOP of edge detector 300 of FIG. 8. As shown in FIG. 8, the time difference between the rising edges of start signal START and stop signal STOP equal a pulse width of input signal INPUT. Thus, if edge detector 300 only comprises inverter 301 and flip flops T1 and T2, the highest detecting frequency is 250 MHz. If edge detector 300 comprises inverter 301 and flip flops T1, T2, T3, T4, T5, T6, T7 and T8, the highest detecting frequency reaches 4 GHz.

Figure 10:
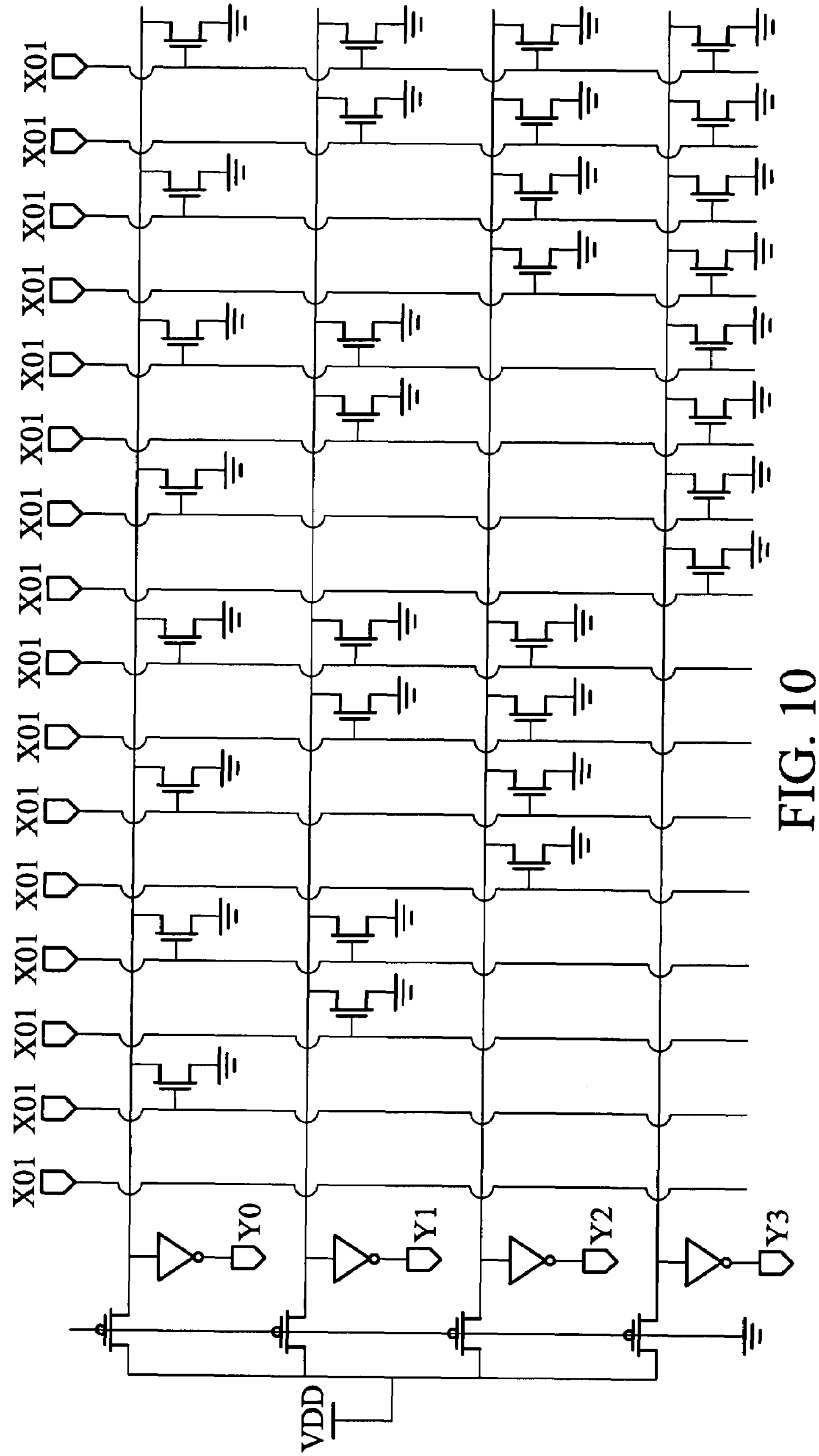
FIG. 10 shows a first readout circuit according to another embodiment of the invention.

FIG. 10 shows first readout circuit 600 according to another embodiment of the invention. First readout circuit 600 receives digital codes ($P_0 \sim P_{n-1}$) from multi phase sampling detector 400 to generate digital codes ($C_0 \sim C_3$).

Figure 11:
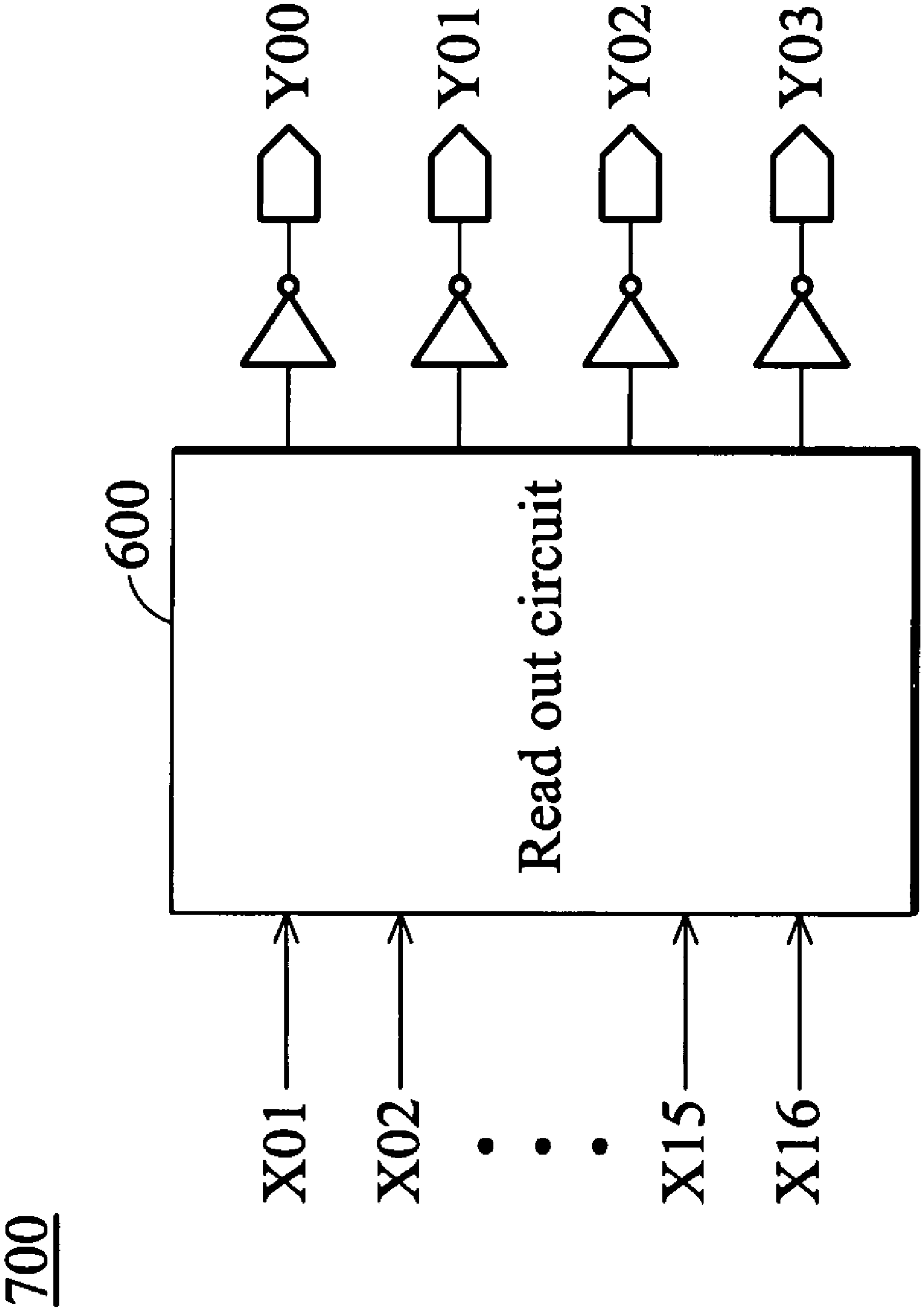
FIG. 11 shows a second readout circuit according to another embodiment of the invention.

FIG. 11 shows second readout circuit 700 according to another embodiment of the invention. Second readout circuit 700 comprises not only first readout circuit 600 but also four inverters. Thus, the outputs of first readout circuit 600 and second readout circuit 700 are opposite. Second readout circuit 700 receives digital codes ($V_0 \sim V_{m-1}$) from VDL sampling detector 500 to generate digital codes ($F_0 \sim F_3$). As shown in FIG. 10 and FIG. 11, the input terminals of readout circuits 600 and 700 respectively receive digital codes ($P_0 \sim P_{n-1}$) and ($V_0 \sim V_{m-1}$). Output terminals ($Y_0 \sim Y_3$ & $Y_{00} \sim Y_{03}$) of FIG. 10 and FIG. 11 respectively output digital codes ($C_0 \sim C_3$) and ($F_0 \sim F_3$). Each of first readout circuit 600 and second readout circuit 700 is a 16-4 decoding circuit. Using cycle time to digital converter 100 as an example, multi phase sampling detector 400 outputs the corresponding digital code when the start signal START begins to lag behind stop signal STOP. Start signal START' input to VDL sampling detector 500 is ahead of stop signal STOP'. Therefore, the higher the time difference multi phase sampling detector 400 detects, the longer the pulse width of input signal INPUT, and the higher time difference the VDL sampling detector 500 detects, the shorter the pulse width of input signal INPUT. Using output terminal $Y_0$ of first readout circuit of FIG. 10 as an example, if all NMOS transistors in the same row (corresponding to output terminal $Y_0$) are turned off, the output of output terminal $Y_0$ is low voltage level. Output terminals Y1, Y2 and Y3 are similar. In addition, first readout circuit 600 and second readout circuit 700 output binary digital codes.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A cycle time to digital converter, comprising a dual delay lock loop generating a first voltage corresponding to a first delay time and a second voltage corresponding to a second delay time according to a clock signal;

a multi phase sampling detector receiving a first start signal, a first stop signal and the first voltage, detecting a coarse delay time according to the first start signal and the first stop signal, generating first group signals according to the coarse delay time, delaying the first stop signal by a common delay time to generate a second stop signal, and delaying the first start signal by the coarse delay time and the common delay time to generate a second start signal; and a VDL sampling detector receiving the first voltage, the second voltage, the second start signal and the second stop signal, detecting a fine delay time according to the second start signal and the second stop signal, and generating second group signals according to the fine delay time.

2. The cycle time to digital converter as claimed in claim 1, wherein the coarse delay time is an integral time of the first delay time.

3. The cycle time to digital converter as claimed in claim 1, wherein the first start signal is delayed by the coarse delay time until the first start signal begins behind the first stop signal.

4. The cycle time to digital converter as claimed in claim 1, wherein the VDL sampling detector further comprises M stage delay modules coupled serially, each stage delay module comprising a first input terminal, a second input terminal, a first output terminal, a second output terminal and a third output terminal, the first output terminal of each stage delay module coupled to the first input terminal of the next stage delay module, the second output terminal of each stage delay module coupled to the second input terminal of the next stage delay module, the third output terminal outputs a fine signal corresponding to the fine delay time.

5. The cycle time to digital converter as claimed in claim 4, wherein the delay module comprises:

a flip flop comprising a first terminal coupled to the first input terminal, a second terminal coupled to the second input terminal and a third terminal coupled to the third output terminal; and a first delay unit delaying signals by the first delay time and comprising a fourth terminal coupled to the first input terminal and a fifth terminal coupled to the first output terminal; and a second delay unit delaying signals by the second delay time and comprising a sixth terminal coupled to the second input terminal and a seventh terminal coupled to the second output terminal.

6. The cycle time to digital converter as claimed in claim 1, wherein the multi phase sampling detector and the VDL sampling detector further comprise a plurality of dummy devices to equalize loading between the start signal and the stop signal.

7. The cycle time to digital converter as claimed in claim 1, wherein the multi phase sampling detector comprises a flip flop, a delay device, N stage delay devices and a matching delay unit, each stage delay device comprising a first input terminal, a second input terminal, a third input terminal, a control terminal, a first output terminal, a second output terminal, a third terminal and a fourth output terminal, the first output terminal of each stage delay device coupled to the first input terminal of the next stage delay device, the second output terminal of each stage delay device coupled to the second input of the next stage delay device, the third input terminal of each stage delay device receiving the stop signal, the third output terminal coupled to the control terminal for controlling the fourth output terminal to output, the flip flop receiving the start signal and the stop signal and outputting to the second input terminal of the first stage delay device, the delay device delaying the start signal by the first delay time and outputting to the first input terminal of the first stage delay device, the fourth output terminal outputting a signal corresponding to the coarse delay time.

8. The cycle time to digital converter as claimed in claim 7, wherein each stage delay device comprises:

a first flip flop comprising a flip flop input terminal coupled to the first input terminal, a control terminal coupled to the third input terminal and a flip flop output terminal coupled to the second output terminal;

a first delay circuit delaying signals by the first delay time and comprising a delay circuit input terminal coupled to the first input terminal and a delay circuit output terminal coupled to the first output terminal;

a second delay circuit comprising a second delay circuit input terminal coupled to the first input terminal, a second delay circuit output terminal coupled to the fourth output terminal and a delay circuit control terminal coupled to the control terminal; and a XOR gate comprising a first XOR input terminal coupled to the second input terminal, a second XOR input terminal coupled to the second output terminal and an XOR output terminal coupled to the third output terminal.

9. The cycle time to digital converter as claimed in claim 1, wherein the multi phase sampling detector further comprises an interface circuit, the interface circuit delaying the first start signal by the coarse delay time and transmitting the first start signal through a first delay device and a second delay circuit according to the first group signals, and wherein the common delay time is the sum of the delay times of the first delay device and the second delay circuit.

10. The cycle time to digital converter as claimed in claim 1, further comprising an edge detector receiving an input signal and generating the first start signal and the first stop signal according to a rising edge and a falling edge of the input signal.

11. The cycle time to digital converter as claimed in claim 10, wherein the edge detector comprises:

a first inverter receiving the input signal to generate a first inverting signal;

a first flip flop comprising a first input terminal to receive the input signal, a first output terminal to output the first start signal, a first inverting output terminal and a second input terminal coupled to the first inverting output terminal; and a second flip flop comprising a third input terminal to receive the first inverting signal, a second output terminal to output the first stop signal, a second inverting output terminal and a fourth input coupled to the second inverting output terminal.

12. The cycle time to digital converter as claimed in claim 10, wherein the edge detector comprises a first inverter, a first flip flop, a second flip flop, a third flip flop, a fourth flip flop, a fifth flip flop, a sixth flip flop, a seventh flip flop and an eighth flip flop, each comprising an input terminal, an output terminal, a first terminal and a second terminal, the first terminal coupled to the second terminal, the first inverter receiving an input signal (first signal) to generate a first inverting signal, the first flip flop receiving the input signal to generate a second signal, the third flip flop receiving the second signal to generate a third signal, the fifth flip flop receiving the third signal to generate a fourth signal, the seventh flip flop receiving the fourth signal to generate the first start signal, the second flip flop receiving the first inverting signal to generate a fifth signal, the fourth flip flop receiving the fifth signal to generate a sixth signal, the sixth flip flop receiving the sixth signal to generate a seventh signal, the eighth flip flop receiving the seventh signal to generate the first stop signal.

13. The cycle time to digital converter as claimed in claim 12, wherein the edge detector further comprises a pulse dividing frequency function.

14. The cycle time to digital converter as claimed in claim 1, wherein the dual delay lock loop comprises:

a first N stage delay circuit comprising N first delay circuits coupled in serial, each first delay circuit delaying the clock signal by the first delay time according to the first voltage and generating a first delay clock signal;

a second N stage delay circuit comprising N second delay circuits coupled in derail, each second delay circuit delaying the clock signal by the second delay time according to the second voltage and generating a second delay clock signal;

a third delay circuit receiving the first delay clock signal, delaying the first delay clock signal by the first delay time according to the first voltage and generating a third delay clock signal;

a first phase frequency detector detecting the clock signal and the first delay clock signal to output a first control signal;

a second phase frequency detector detecting the second delay clock signal and the third delay clock signal to output a second control signal;

a first charge pump outputting the first voltage according to the first control signal;

a second charge pump outputting the second voltage according to the second control signal;

a first low pass filter filtering the first voltage; and a second low pass filter filtering the second voltage.

15. The cycle time to digital converter as claimed in claim 1, further comprising:

a first readout circuit receiving and coding the first group signals to output first group coding signals; and a second readout circuit receiving and coding the second group signals to output second group coding signals.

16. The cycle time to digital converter as claimed in claim 15, wherein the first readout circuit and the second readout circuit are 16-4 coding circuits.

17. The cycle time to digital converter as claimed in claim 15, wherein the first group coding signals and the second group coding signals are binary digital codes.

18. The cycle time to digital converter as claimed in claim 12, wherein the range of the input signal is between 147 MHz and 1.639 GHz.

19. A cycle time to digital converter, comprising a dual delay lock loop generating a first voltage corresponding to a first delay time and a second voltage corresponding to a second delay time according to a clock signal;

a multi phase sampling detector receiving a first start signal, a first stop signal and the first voltage, detecting a coarse delay time according to the first start signal and the first stop signal, generating first group signals according to the coarse delay time, delaying the first stop signal by a common delay time to generate a second stop signal, and delaying the first start signal by the coarse delay time and the common delay time to generate a second start signal;

a VDL sampling detector receiving the first voltage, the second voltage, the second start signal and the second stop signal, detecting a fine delay time according to the second start signal and the second stop signal, and generating second group signals according to the fine delay time;

an edge detector receiving an input signal and generating the first start signal and the first stop signal according to a rising edge and a falling edge of the input signal;

a first readout circuit receiving and coding the first group signals to output first group coding signals; and a second readout circuit receiving and coding the second group signals to output second group coding signals.

20. The cycle time to digital converter as claimed in claim 19, wherein the multi phase sampling detector further comprises an interface circuit, the interfacing circuit delaying the first start signal by the coarse delay time and transmitting the first start signal through a first delay device and a second delay device according to the first group signals, and wherein the common delay time is the sum of the delay times of the first delay device and the second delay device.

21. The cycle time to digital converter as claimed in claim 19, wherein the first readout circuit and the second readout circuit are 16-4 coding circuits.

22. The cycle time to digital converter as claimed in claim 19, wherein the first group coding signals and the second group coding signals are binary digital codes.

* * * * *